Figure 1:
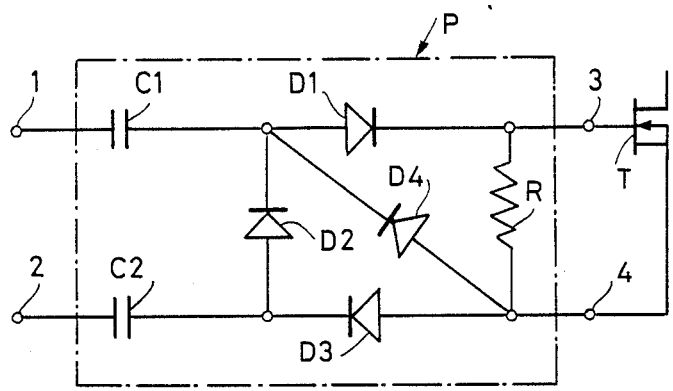

United States Patent [19]

Musumeci et al.

[11] Patent Number: 4,969,030
[45] Date of Patent: Nov. 6, 1990

[54] INTEGRATED STRUCTURE FOR A SIGNAL TRANSFER NETWORK, IN PARTICULAR FOR A PILOT CIRCUIT FOR MOS POWER TRANSISTORS

[75] Inventors: Salvatore Musumeci, Riposto; Roberto Pellicanó, Reggio Calabria; Sergio Palara, Acicastello, all of Italy

[73] Assignee: SGS-Thomson Microelectronics S.P.A., Catania, Italy

[21] Appl. No.: 504,720

[22] Filed: Apr. 3, 1990

Related U.S. Application Data

[63] Continuation of Ser. No. 162,678, Mar. 1, 1988, abandoned.

[30] Foreign Application Priority Data

Mar. 5, 1987 [IT] Italy .................................. 62-19593A

[51] Int. Cl.[5] ............................................. H01L 27/04
[52] U.S. Cl. ......................................... 357/48; 357/51
[58] Field of Search ............................... 357/48, 49, 51

[56] References Cited

U.S. PATENT DOCUMENTS

| 4,163,245 | 7/1979 | Kinoshita | 357/48 |
|---|---|---|---|
| 4,628,341 | 12/1986 | Thomas | 357/48 |
| 4,648,909 | 3/1987 | Krishna | 357/48 |
| 4,651,178 | 3/1987 | Avery | 357/48 |
| 4,725,561 | 2/1988 | Haond et al. | 357/49 |

FOREIGN PATENT DOCUMENTS

| 117867 | 9/1984 | European Pat. Off. . | |
|---|---|---|---|
| 2543364 | 9/1984 | France . | |
| 60-124863 | 7/1985 | Japan | 357/48 |
| 60-140844 | 7/1985 | Japan | 357/48 |
| 486127 | 2/1970 | Switzerland . | |

Primary Examiner—William D. Larkins
Assistant Examiner—Mark Prenty
Attorney, Agent, or Firm—Cushman, Darby & Cushman

[57] ABSTRACT

The integrated structure is formed of various circuital components accomplished by diffusion of dopants in a semiconductor substrate. Each component is located inside a respective insulation recess electrically floating in relation to the substrate and the other components.

12 Claims, 3 Drawing Sheets

INTEGRATED STRUCTURE FOR A SIGNAL TRANSFER NETWORK, IN PARTICULAR FOR A PILOT CIRCUIT FOR MOS POWER TRANSISTORS

This is a continuation of Application No. 07/162,678, filed Mar. 1, 1988, which was abandoned upon the filing hereof.

The present invention relates to an integrated structure for a signal transfer network, in particular for an MOS power transistor pilot circuit.

Piloting of MOS power transistors with command signals ohmically decoupled from those present on the load is normally done with circuital networks consisting of decoupling condensers, rectifying diodes and disturbance elimination resistors.

The accomplishment of said circuital networks with discrete components or in hybrid form represents a known solution which is costly from the viewpoint of size and assembly of the components. An integrated structure enclosing the entire circuit in a single chip would undoubtedly reduce the overall size of the circuit but it is not accomplishable with presently known integration methods, in accordance with which the different components are placed directly on a semiconductor substrate. In this manner, through the substrate there is created among the different components a parasite coupling which prevents the greater part of the changes transferred from the input signal from reaching the gate of the MOS power transistor.

The object of the present invention is to accomplish an integrated structure, in particular for pilot circuits but generally useable for signal transfer networks, which would be free from the abovementioned shortcoming.

In accordance with the invention said object is achieved by an integrated structure consisting of circuital components accomplished by the diffusion of dopes in a semiconductor substrate characterized in that each of said components is located inside a respective electrically floating insulation recess which separates it from the substrate and from the other components.

In this manner the total coupling capacitance between components is given by the series of capacitances between the individual component and the respective recess and between the recess and the substrate and is hence considerably reduced. The parasite capacitive couplings thus affect slightly the transfer of the charges from the input to the output of the circuit.

Figure 4:
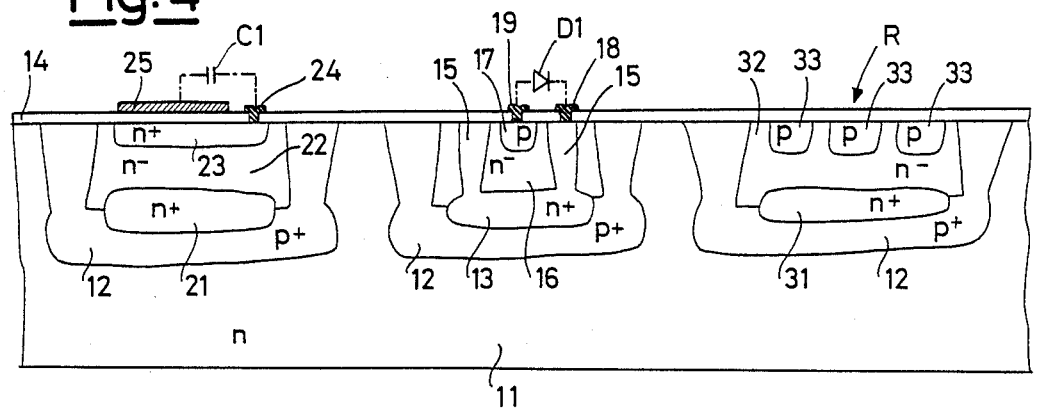
Figure 5:
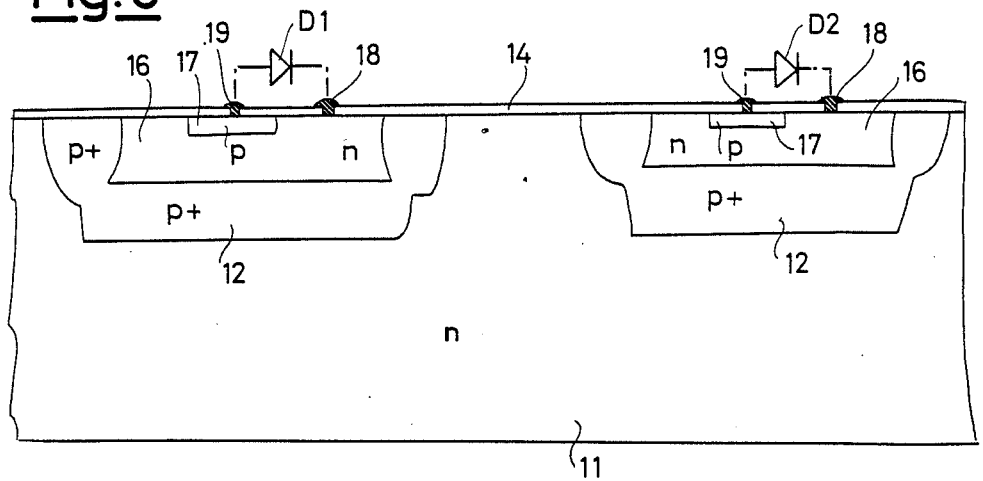
Figure 2:
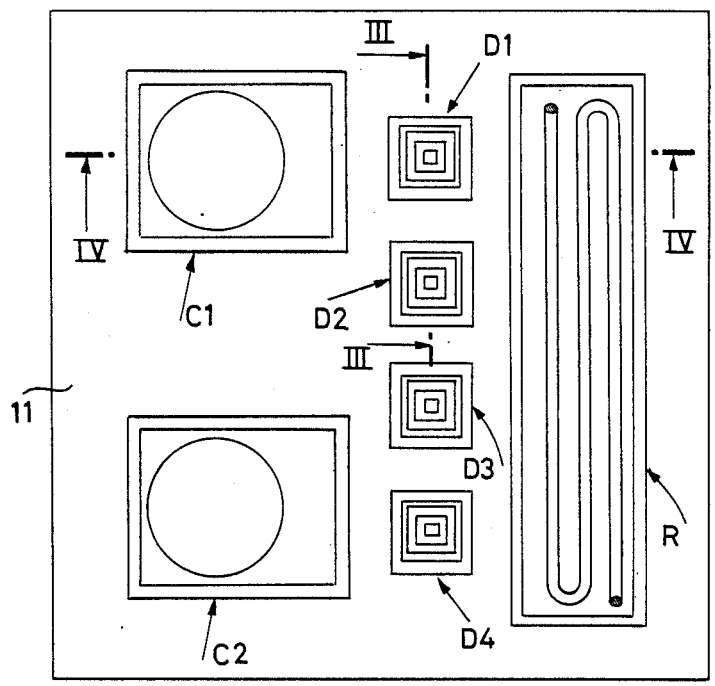
Figure 3:
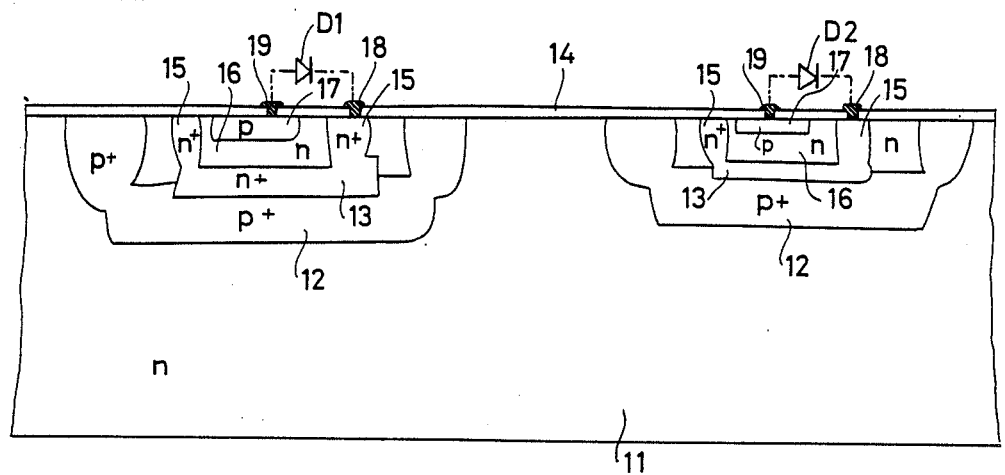
Figure 6:
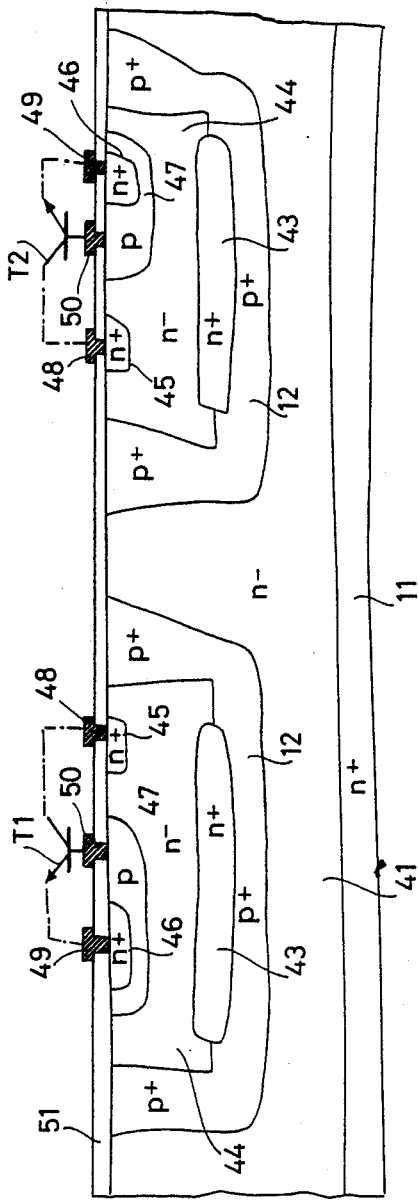
Figure 7:
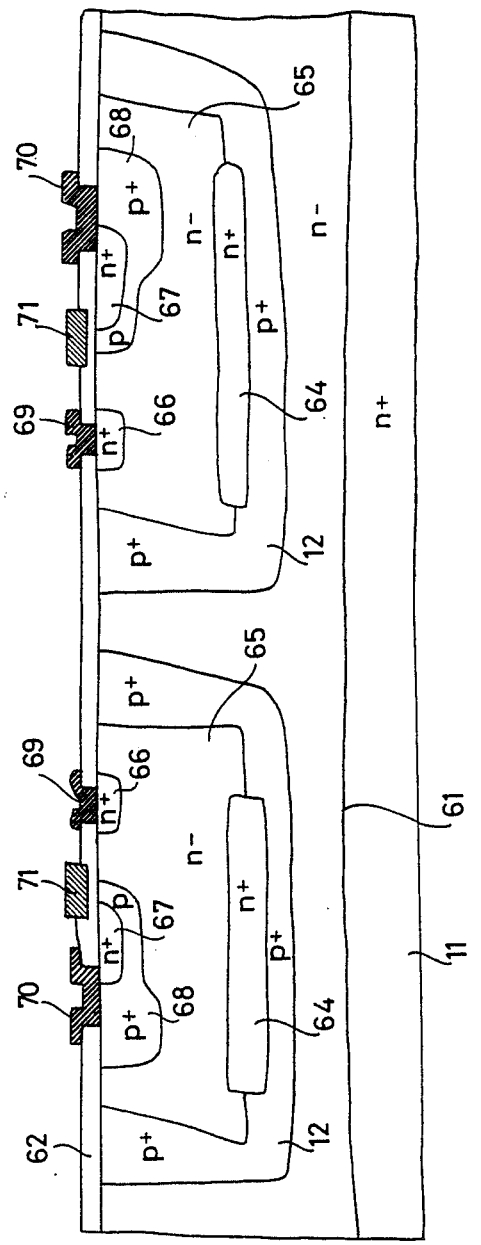

The characteristics of the present invention will be made clearer by the following detailed description of its possible forms of practical accomplishment illustrated as nonlimiting examples in the annexed drawings wherein:

FIG. 1 shows the circuital diagram of a pilot circuit for MOS power transistors known in itself, FIG. 2 shows a plan view of an integrated structure in accordance with the invention for said pilot circuit, FIG. 3 shows a cross section of said integrated structure along line III—III of FIG. 2, FIG. 4 shows a more detailed cross section of said integrated structure along the line IV—IV of FIG. 2, FIG. 5 shows a section similar to that of FIG. 3 of a variant of said integrated structure in accordance with the invention, FIGS. 6 and 7 show integrated circuits in accordance with the invention for circuits including respectively bipolar transistors and MOS transistors.

In the diagram shown in FIG. 1 a pilot circuit P equipped with pilot input terminals 1 and 2 and output terminals 3 and 4 is shown assigned to gate piloting of an MOS power transistor T.

The pilot circuit includes two condensers C1, C2 placed on the two input terminals 1, 2 for decoupling between the input signal and the transistor T, a 4-diode system D1-D4 with rectifying functions and a resistor R placed between the two output terminals 3, 4 to shunt and thus eliminate any interference which could otherwise reach the gate of the transistor T by the capacitive way and cause self ignition of said transistor.

The diodes D1-D4 are selected in such a manner as to hold an inverse voltage of over 15V. The resistor R is selected between 75 and 500 kohm. The condensers C1 and C2 are selected in such a manner as to have a capacitance greater than 10pF.

The input signal consists of a pair of complementary square waves with a frequency around 1 MHz and amplitude around 10V.

Said pilot circuit can also be used to control two MOS power transistors connected with a common source or drain to accomplish an alternating current switch or to control the higher part of an MOS power transistor semibridge.

FIGS. 2-4 show how said pilot circuit can be accomplished in an integrated structure in accordance with the present invention.

In a semiconductor substrate 11 with N doping (optionally provided with one or more epitaxial strata in accordance with the known art) there are accomplished for the various circuital components (C1, C2; D1-D4; R) respective electrically floating insulation recesses 12 of type P+ inside of which are formed the same components by diffusion of types N and P dopants.

As shown in FIGS. 3 and 4 each diode D1-D4 includes a type N+ buried layer 13 which communicates with the surface of the substrate (covered with oxide 14) through sinker regions 15. Inside the N+ doped area formed by the buried layer 13 and the contact regions 15 with the interposition of an N− doped area there is accomplished a P area 17. The two areas 15 and 17 can be reached through surface contacts 18 and 19 and constitute the two terminals of the diode symbolized in dot and dash lines in the aforesaid figures.

As shown in FIG. 4 each condenser C1-C2 includes an N+ doped buried layer 21, an intermediate N− doped area 22 and an N+ doped surface area 23. This last area, which can be reached through a surface contact 24, constitutes one of the condenser plates while the other is made up of a surface metallization 25 placed on a portion of the oxide 14 which constitutes the condenser dielectric. In this case also the condenser is symbolized in dash and dot lines.

The resistor R, illustrated in FIGS. 2 and 4 calls for an N+ doped buried layer 31, an N− doped intermediate layer 32 and a P doped surface area 33 accomplished in coil form as shown in FIG. 2.

Alternatively the buried layers 13, 21, 31 and the sinker regions 15 can be lacking so that the diodes D1-D4, the condensers C1-C2 and the resistor R can assume the form shown in FIG. 5 (for the diodes D1 and D2).

In addition, each of the doped layers described above can be doped in the opposite manner, i.e. N doping instead of P doping and vice versa and the substrate 11 can be type P and the recess 12 type N.

In any case the overall capacitance between one component and the next is given by the series of capacitances between the individual component and the respective recess 12 and between the latter and the substrate 11, i.e. it is halved in relation to the conventional integration technique without insulating recesses.

With the quantitative values already given, the pilot circuit shown in FIGS. 2–4 or 5 operates in such a manner that a 10V square wave signal at the input and with a frequency of 1 MHz can allow reaching the continuous 8V at the gate of an MOS power transistor with input capacity of 600 pF.

As mentioned above, the integrated structure in accordance with the invention, i.e. with an insulating recess for each component, is employable not only for pilot circuits but in general for signal transfer networks. The components employed can be diodes, condensers, resistors or even transistors of any type.

In this respect the need can arise to capacitively decouple active components like bipolar transistors (NPN or PNP) or MOS transistors (N channel or P channel), forming part of circuits which require low cross-talk.

In this case the transistors to be separated, e.g. the two input transistors of two associated amplifiers, can be accomplished in an integrated structure in accordance with the present invention.

More precisely, as shown in FIG. 6, two bipolar transistors T1–T2 can be formed in a single semiconductor substrate 11 with N+ doping, provided with an N− epitaxial layer 41 covered with oxide 51. Each transistor is enclosed in a respective P+ electrically floating insulation recess 12 and comprises an N+ buried layer 43, an N− doped intermediate area and surface areas 45, 46, 47 of which the first two are N+ doped and the third is P doped enclosing said area 46. Electrical contacts 48 and 49 pass through the oxide layer 51 until they reach the N+ areas 45 and 46 to constitute the collector and emitter terminals of the transistor. In a similar manner an electrical contact 50 reaches the P area 47 to constitute the base terminal of said transistor.

An integrated structure in accordance with the invention comprising two MOS transistors is shown in FIG. 7 where reference number 11 indicates an N+ substrate provided with an N− epitaxial layer 61 and an overlying oxide layer 62. Each transistor is formed inside a respective electrically floating P+ insulation recess 12 and comprises an N+ buried layer 64, an N− intermediate area 65 and surface areas 66, 67 and 68 of which the first two are N+ and the third is P+ enclosing said area 67. Electrical contacts 69 and 70 pass through the oxide layer 62 until the first reaches the area 66 and the second the side by side areas 67 and 68 to constitute respectively the drain and source terminals of the transistor. A strip of polysilicon 71 is overlaid on the surface areas 67 and 68 between the two contacts 69 and 70 over part of the oxide layer 62 to constitute the gate terminal of the transistor.

What is claimed is:

1. Integrated structure for a signal transfer network, comprising:
   a semiconductor substrate having component portions and a remaining portion;
   a plurality of circuit components formed by diffusion of dopant material in said component portions of said semiconductor substrate, including adjacent first and second components; and
   a plurality of electrically floating portions corresponding to said plurality of circuit components and formed by diffusion of dopant material in said semiconductor substrate, each circuit component being electrically isolated from the remaining portions of said semiconductor substrate by corresponding ones of said electrically floating portions and being electrically isolated from every other circuit component by said corresponding ones of said electrically floating portions, whereby the total capacitance between adjacent first and second components having corresponding first and second electrically floating portions is approximately the series connections of the capacitances between the first component and the first electrically floating portion, the first electrically floating portion and the remaining portion of the substrate, the remaining portion of the substrate and the second electrically floating portion, and the second electrically floating portion and the second component.

2. Integrated structure in accordance with claim 1 wherein at least one of said components is a diode.

3. Integrated structure in accordance with claim 2 wherein said diode comprises a buried doped layer of a first type provided with sinker regions constituting one of the terminals of the diode, and an area with doping of a second type constituting the other terminal of the diode.

4. Integrated structure in accordance with claim 2 wherein said diode comprises an area with doping of a first type and an area with doping of a second type, constituting the two terminals of the diode.

5. Integrated structure in accordance with claim 1 wherein at least one of said components is a condenser.

6. Integrated structure in accordance with claim 5 wherein said condenser comprises a doped buried layer, an intermediate layer with doping of the same type as the buried layer and a surface area with doping of the same type as the buried layer, the latter constituting a plate of the condenser and another plate consisting of a surface metallization on the dielectric layer.

7. Integrated structure in accordance with claim 1 wherein at least one of said components comprises a resistor.

8. Integrated structure in accordance with claim 7 wherein said resistor comprises a buried layer with doping of a first type different from that of the corresponding electrically floating portion, an intermediate layer with doping of the first type forming a further electrically floating portion arranged inside said corresponding electrically floating portion and at least one surface area with doping of a second type arranged inside said further electrically floating portion.

9. Integrated structure in accordance with claim 1 wherein at least one of said components consists of a bipolar transistor.

10. Integrated structure in accordance with claim 9 wherein said bipolar transistor comprises a buried layer with doping of a firs type, an intermediate area with doping of the first type, a first surface area with doping of the first type, a second surface area with doping of the first type and a third surface area with doping of a second type, said first, second and third surface areas constituting respectively the collector, emitter and base terminals of the bipolar transistor.

11. Integrated structure in accordance with claim 1 wherein at least one of said components comprises a MOS transistor.

12. Integrated structure in accordance with claim 11 wherein said MOS transistor comprises a buried layer with doping of the first type, an intermediate area with doping of the first type, a first surface are with doping of the first type, a second surface area with doping of the first type, a third surface area with doping of the second type and a strip of conducting material overlaid on said second and third surface areas, said first surface area constituting the drain terminal of the transistor, said second and third surface areas forming in combination the source terminal of the transistor and said strip of conducting material constituting the gate terminal of the transistor.

* * * * *